US009053984B2

(12) United States Patent
Kato

(10) Patent No.: US 9,053,984 B2
(45) Date of Patent: Jun. 9, 2015

(54) THIN-FILM TRANSISTOR, DISPLAY UNIT, AND ELECTRONIC APPARATUS

(71) Applicant: Sony Corporation, Tokyo (JP)

(72) Inventor: Yuichi Kato, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/273,847

(22) Filed: May 9, 2014

(65) Prior Publication Data

US 2014/0346499 A1 Nov. 27, 2014

(30) Foreign Application Priority Data

May 24, 2013 (JP) ................... 2013-109773

(51) Int. Cl.
*H01L 27/12* (2006.01)
*H01L 29/10* (2006.01)
*H01L 29/786* (2006.01)

(52) U.S. Cl.
CPC ........ *H01L 27/1225* (2013.01); *H01L 29/7869* (2013.01)

(58) Field of Classification Search
CPC ...... H01L 29/7869; H01L 21/16; H01L 21/00
USPC ............ 257/43; 438/149, 157, 159, 166, 308, 438/404, 424, 467, 477
See application file for complete search history.

(56) References Cited

U.S. PATENT DOCUMENTS

| 2011/0090438 A1* | 4/2011 | Lee ............................... 349/110 |
| 2011/0181786 A1* | 7/2011 | Yamazaki et al. ............ 348/671 |
| 2012/0001167 A1* | 1/2012 | Morosawa ....................... 257/43 |
| 2014/0035478 A1* | 2/2014 | Kitakado et al. .............. 315/210 |

FOREIGN PATENT DOCUMENTS

JP  2012-164873  8/2012

* cited by examiner

*Primary Examiner* — Fernando L Toledo
*Assistant Examiner* — Adam S Bowen
(74) *Attorney, Agent, or Firm* — K&L Gates LLP

(57) ABSTRACT

Provided is a thin-film transistor that includes: a substrate; a first barrier film formed on the substrate; a second barrier film formed in a selective region on the first barrier film, and having a barrier property against hydrogen; an oxide semiconductor layer including a first part formed on the second barrier film and a second part formed on the first barrier film, in which the first part functions as an active layer, and the second part has lower electrical resistance than the first part; a gate electrode formed on the first part of the oxide semiconductor layer with a gate insulating film therebetween; and a source electrode or drain electrode electrically connected to the second part of the oxide semiconductor layer. The first barrier film has a barrier property against an impurity from the substrate and a property of chemically reducing the oxide semiconductor layer.

10 Claims, 13 Drawing Sheets

THIN-FILM TRANSISTOR, DISPLAY UNIT, AND ELECTRONIC APPARATUS

CROSS REFERENCES TO RELATED APPLICATIONS

The present application claims priority to Japanese Priority Patent Application JP 2013-109773 filed in the Japan Patent Office on May 24, 2013, the entire content of which is hereby incorporated by reference.

BACKGROUND

The present disclosure relates to a thin-film transistor (TFT), for example, that uses an oxide semiconductor, and a display unit and an electronic apparatus that use the TFT.

Zinc oxide, oxides containing oxygen and indium, and some other oxides exhibit excellent semiconductor (active layer) properties. In order to apply these oxides to electric devices, such as thin-film transistors (TFTs), light-emitting devices, and transparent conductive films, accordingly, study and development of oxides are being accelerated. It is known that when such oxides are applied to active layers (channels) of TFTs, the TFTs exhibit great electron mobility and superior electrical characteristics, in comparison with TFTs made of amorphous silicon. Moreover, TFTs made of oxides advantageously have the potential for great electron mobility, even when being formed under low temperature conditions, such as at about an ambient temperature.

When a semiconductor device is formed on a substrate made of, for example, silicon (Si) or glass, a silicon nitride film or a silicon oxide film is used as a barrier film that blocks the entry of impurities (e.g., alkali ions) from the substrate to the semiconductor device. For example, Japanese Unexamined Patent Application Publication No. 2012-164873 describes a TFT in which an oxide semiconductor is formed on a surface of a substrate with a barrier film therebetween.

SUMMARY

TFTs made of oxide semiconductors, as described above, are being requested to assure barrier performance and exhibit excellent transistor characteristics.

It is desirable to provide a thin-film transistor, a display unit, and an electronic apparatus, which are capable of achieving excellent transistor characteristics.

A thin-film transistor according to an embodiment of the present disclosure includes: a substrate; a first barrier film formed on the substrate; a second barrier film formed in a selective region on the first barrier film, and having a barrier property against hydrogen; an oxide semiconductor layer including a first part formed on the second barrier film and a second part formed on the first barrier film, in which the first part functions as an active layer, and the second part has lower electrical resistance than the first part; a gate electrode formed on the first part of the oxide semiconductor layer with a gate insulating film therebetween; and a source electrode or drain electrode electrically connected to the second part of the oxide semiconductor layer. The first barrier film has a barrier property against an impurity from the substrate and a property of chemically reducing the oxide semiconductor layer.

A display unit according to an embodiment of the present disclosure is provided with a plurality of pixels. Each of the pixels is provided with a thin-film transistor. Each of the thin-film transistors includes: a substrate; a first barrier film formed on the substrate; a second barrier film formed in a selective region on the first barrier film, and having a barrier property against hydrogen; an oxide semiconductor layer including a first part formed on the second barrier film and a second part formed on the first barrier film, in which the first part functions as an active layer, and the second part has lower electrical resistance than the first part; a gate electrode formed on the first part of the oxide semiconductor layer with a gate insulating film therebetween; and a source electrode or drain electrode electrically connected to the second part of the oxide semiconductor layer. The first barrier film has a barrier property against an impurity from the substrate and a property of chemically reducing the oxide semiconductor layer.

An electronic apparatus according to an embodiment of the present disclosure is provided with a display unit. The display unit is provided with a plurality of pixels, and each of the pixels is provided with a thin-film transistor. Each of the thin-film transistors includes: a substrate; a first barrier film formed on the substrate; a second barrier film formed in a selective region on the first barrier film, and having a barrier property against hydrogen; an oxide semiconductor layer including a first part formed on the second barrier film and a second part formed on the first barrier film, in which the first part functions as an active layer, and the second part has lower electrical resistance than the first part; a gate electrode formed on the first part of the oxide semiconductor layer with a gate insulating film therebetween; and a source electrode or drain electrode electrically connected to the second part of the oxide semiconductor layer. The first barrier film has a barrier property against an impurity from the substrate and a property of chemically reducing the oxide semiconductor layer.

In the thin-film transistor, display unit, and electronic apparatus according to the above-described embodiments of the present disclosure, the first barrier film is formed on the substrate, and the second barrier film that has a barrier property against hydrogen is formed between the first barrier film and the first part of the oxide semiconductor layer. The first barrier film suppresses a film quality of the entire oxide semiconductor layer from being deteriorated by an impurity, and selectively decreases electrical resistance of the second part of the oxide semiconductor layer. In addition, the interposition of the second barrier suppresses hydrogen in the first barrier film from diffusing into the first part of the oxide semiconductor layer, thereby reducing property fluctuation of the first part which would be caused by a chemical reducing effect.

The thin-film transistor, display unit, and electronic apparatus according to the above-described embodiments of the present disclosure each have the first barrier film on the substrate, and the second barrier film which has a barrier property against hydrogen between the first barrier film and the first part of the oxide semiconductor layer. The first barrier film makes it possible to suppress a film quality of the entire oxide semiconductor layer from being deteriorated by an impurity, and to selectively decrease electrical resistance of the second part of the oxide semiconductor layer. In addition, the interposition of the second barrier makes it possible to reduce property fluctuation of the first part of the oxide semiconductor layer which would be caused by the diffusion of the hydrogen from the first barrier film. It is thus possible to assure barrier performance, to decrease electrical resistance of a desired region of an oxide semiconductor layer, and to reduce property fluctuation of an active layer. Consequently, it is possible to provide excellent transistor characteristics.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, embodiment and application examples of the present disclosure will be described in detail, with reference to the accompanying drawings. The description will be given in the following order.

1. Embodiment (an exemplary top gate type thin-film transistor that has a second barrier film ($SiO_2$) between a first barrier film (SiN) and an active layer of an oxide semiconductor layer)
2. Application examples (exemplary display unit and electronic apparatuses)

[Embodiment]

(Configuration)

Figure 1:
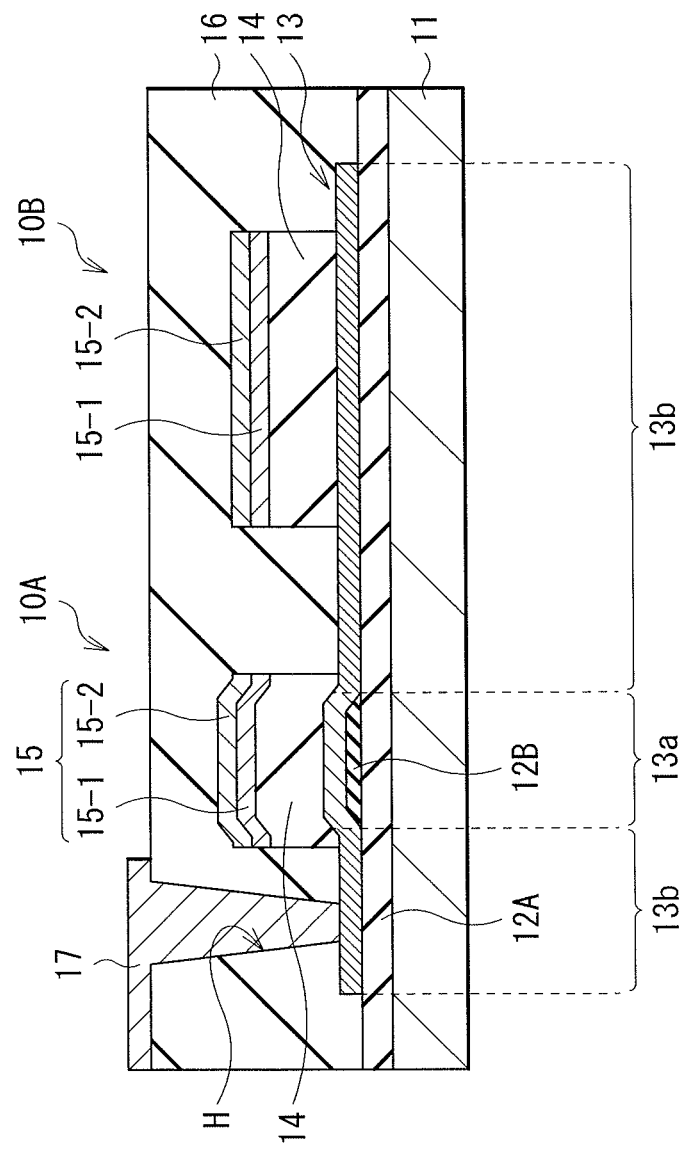
FIG. 1 is a view showing a cross-sectional configuration of a transistor and a retention capacity according to an embodiment of the present disclosure.

FIG. 1 is a view showing a cross-sectional configuration of a thin-film transistor (transistor 10A) and a retention capacity (retention capacity 10B) according to an embodiment of the present disclosure. The transistor 10A may have a so-called top gate structure, and may be used as an element that drives an active matrix type organic EL display unit, a liquid crystal display unit, or the like.

The transistor 10A may be formed, for example, by stacking a first barrier film 12A, a second barrier film 12B, an oxide semiconductor layer 13, a gate insulating film 14, and a gate electrode 15 on a substrate 11 in this order. Part (second part 13b to be described below) of the oxide semiconductor layer 13 is electrically connected to a source/drain electrode 17.

Specifically, the first barrier film 12A may be formed, for example, so as to cover the surface of the substrate 10; the second barrier film 12B is formed in a selective region on the first barrier film 12A. The oxide semiconductor layer 13 has a first part 13a and the second part 13b on the second barrier film 12B and the first barrier film 12A, respectively; the first part 13a functions as an active layer (channel), and the second part 13b has lower electrical resistance than the first part 13a. In other words, within a region directly below the first part 13a of the oxide semiconductor layer 13, the first barrier film 12A and the second barrier film 12B are stacked on the substrate 11 in this order; within a region directly below the second part 13b, only the first barrier film 12A is formed on the substrate 11. As described above, the second part 13b of the oxide semiconductor layer 13 is formed in contact with the first barrier film 12A; the first part 13a is formed on the first barrier film 12A with the second barrier film 12B therebetween.

The retention capacity 10B corresponds to, for example, a retention capacity element (retention capacity element 5C) to be described below. The retention capacity 10B is formed on the substrate 11 by using a portion of the second part 13b of the oxide semiconductor layer 13. More specifically, the retention capacity 10B is formed by stacking electrode layers 15-1 and 15-2 on the second part 13b with the gate insulating film 14 therebetween. The gate insulating film 14 and the electrode layers 15-1 and 15-2 may be patterned together with the gate insulating film 14 and electrode layers 15-1 and 15-2 (gate electrode 15) in the transistor 10A, during the same process.

The substrate 11 may be made of, for example, silicon, glass, or a flexible material. Examples of the flexible material may include a polyimide (PI), polyethylene terephthalate (PET), polyethersulfone (PES), polyethylene naphthalate (PEN), polycarbonate (PC), liquid crystal polymer, and other resin materials. In addition to the above resin materials, examples of the flexible material may further include a stainless steel (SUS), aluminum (Al), copper (Cu), and other flexible metal sheets, each surface of which is subjected to an insulating treatment. The thickness of the substrate 11 may be, for example, 0.015 mm to 1 mm.

The first barrier film 12A has a barrier property against incoming impurities (e.g., alkali ions and moisture) from the substrate 11, and a property of chemically reducing the oxide semiconductor layer 13. Examples of a material that fulfills these functions may include a silicon nitride (SiN) and silicon oxynitride (SiON). Although there is no limitation on the chemical reducing property of the first barrier film 12A, for example, the first barrier film 12A may preferably contain hydrogen (H) atoms of $3 \times 10^{21}/cm^3$ or more. This hydrogen amount may be analyzed, for example, using a Fourier-transform type of infrared spectroscopic analyzer (FT-IR). The thickness of the first barrier film 12A may be, for example, 50 nm to 1000 nm, more specifically, about 200 nm.

The second barrier film 12B is formed on the first barrier film 12A in an island shape, so as to oppose both the first part 13a of the oxide semiconductor layer 13 and the gate electrode 15. The second barrier film 12B has a barrier property against hydrogen. In more detail, the second barrier film 12B has a function of suppressing the chemical reduction of the oxide semiconductor layer 13 by suppressing the hydrogen contained in the first barrier film 12A from entering the oxide semiconductor layer 13. The second barrier film 12B may be, for example, a single-layered film made of one or more of oxide silicon ($SiO_2$), silicon oxynitride, aluminum oxide ($Al_2O_3$), and titanium oxide ($TiO_2$), or a stacked film made of two or more of the above.

Figure 2:
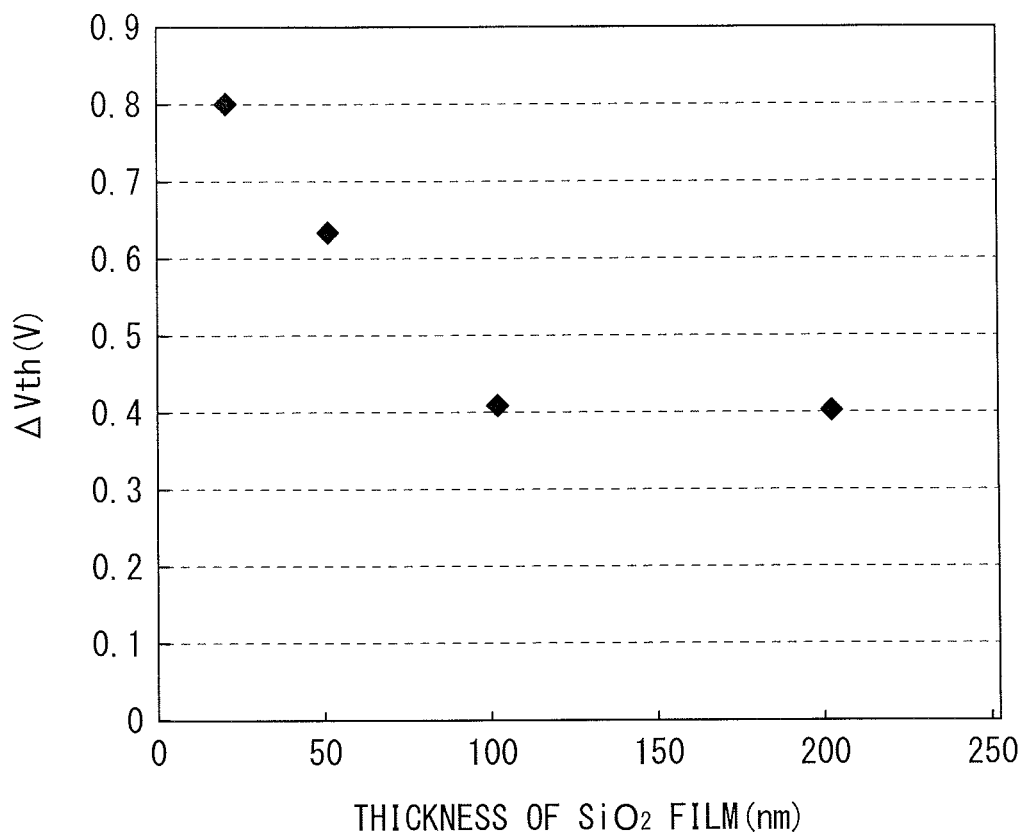
FIG. 2 is a characteristic diagram showing a relationship between a thickness of a second barrier film of the transistor and a shift amount of a threshold voltage of the transistor.

By not way of limitation, the thickness of the second barrier film 12B may be, for example, 20 nm or more. In addition, the thickness of the second barrier film 12B may be preferably equal to or smaller than that of the oxide semiconductor layer 13, in order to ensure the coverage capacity of the oxide semiconductor layer 13, namely, in order to prevent the oxide semiconductor layer 13 from being broken off or damaged at steps, etc. Alternatively, the thickness of the second barrier film 12B may be determined from an experiment result for a threshold voltage of the transistor 10A which will be described below. FIG. 2 indicates a relationship between the thickness of the second barrier film 12B and a shift amount ($\Delta Vth$) of the threshold voltage. While the thickness of the second barrier film 12B was varied in a range from 20 nm to 200 nm, the shift amounts ($\Delta Vth$) of the threshold voltages were measured. Below the thickness of 100 nm, as the thickness decreases, the shift amount of the threshold voltage increases (a so-called "depletion shift" is generated). At or above the thickness of 100 nm, the shift amount of the threshold voltage does not greatly change with the thickness. The experiment reveals that the thickness of the second barrier film 12B has a saturation point with regard to the shift amount of the threshold voltage of the transistor 10A.

The oxide semiconductor layer 13 may be made of, for example, a chemical compound containing oxygen and at least one element of indium (In), gallium (Ga), zinc (Zn), tin (Sn), and the like. More specifically, examples of an amorphous oxide semiconductor may include indium gallium zinc oxide (IGZO) and indium tin zinc oxide (ITZO). Examples of a crystalline oxide semiconductor may include zinc oxide (ZnO), indium zinc oxide (IZO), indium gallium oxide (IGO), indium tin oxide (ITO), and indium oxide (InO). For example, the thickness of the oxide semiconductor layer 13 may be preferably 5 nm to 100 nm, more specifically, about 50 nm, in view of an oxygen supply efficiency during annealing of manufacturing processing.

The oxide semiconductor layer 13 is formed in an island shape, so as to contain the gate electrode 15 and its adjacent region. As described above, the oxide semiconductor layer 13 includes the first part 13a as the active layer of the transistor 10A, and the second part 13b as a low electrical resistance region. The first part 13a forms a channel by being applied a predetermined gate voltage, and has substantially the same shape as the second barrier film 12B. The gate insulating film 14 and the gate electrode 15 that each have substantially the same shape as the first part 13a are provided so as to oppose the first part 13a.

The second part 13b is formed so as to adjoin (surround) the first part 13a and to make contact with the first barrier film 12A. The second part 13b formed in this manner functions as source and drain regions; for example, one of the source and drain regions is electrically connected to the source/drain electrode 17, and the other is electrically connected to the retention capacity 10B (configures part of the retention capacity 10B, in this case). The second part 13b is in contact with the first barrier film 12A, and its electrical resistance is thereby decreased due to the chemical reducing property of the first barrier film 12A (due to the chemical reducing property of the hydrogen contained in the first barrier film 12A). More specifically, for example, the hydrogen contained in the first barrier film 12A grabs bonds of oxygen contained in the oxide semiconductor layer 13 (second part 13b). As a result, the electron density in the second part 13b is increased so that its electrical resistance is decreased. The electrical resistance of the second part 13b is set appropriately by selecting the constituent material and adjusting the thickness of the oxide semiconductor layer 13, the chemical reducing property (hydrogen amount) of the first barrier film 12A, process conditions, and the like. The first part 13a is formed so as not to make direct contact with the first barrier film 12A (formed on the first barrier film 12A with the second barrier film 12B therebetween). Therefore, the first part 13a is not affected by (or less influenced by) the chemical reducing property of the first barrier film 12A so that the electrical resistance of the first part 13a is not decreased (or resists being decreased).

The second part 13b of the oxide semiconductor layer 13 is formed adjacent to the first part 13a. This enables the second part 13b to be connected to the source/drain electrode 17 while opposing the source/drain electrode 17. It is thus possible to form both the gate electrode 15 and the source/drain electrode 17 so as not to overlap each other, thereby decreasing parasitic capacitance in the transistor 10A.

Each gate insulating film 14 may have a thickness of, for example, about 300 nm, and be a single-layered film made of, for example, one of oxide silicon, silicon nitride, silicon oxynitride, aluminum oxide, aluminum nitride, and the like, or a stacked film made of two or more of the above. Among them, in particular, oxide silicon and aluminum oxide are preferred, because neither of oxide silicon and aluminum oxide chemically reduces the oxide semiconductor layer 13 easily.

The gate electrode 15 applies a gate voltage to the transistor 10A, and serves a purpose of controlling the electron density in the oxide semiconductor layer 13 (first part 13a) by using this gate voltage. The thickness of the gate electrode 15 may be, for example, 10 nm to 500 nm, more specifically, about 500 nm. The gate electrode 15 is formed of, for example, a stacked film including the electrode layers 15-1 and 15-2. The electrode layer 15-1 may be configured by forming a barrier metal made of titanium (Ti), molybdenum (Mo), or the like on a surface of a metal layer made of aluminum (Al), copper (Cu), or the like. The electrode layer 15-2 may be configured with an oxide semiconductor made of ITO, IZO, IGZO, or the like. Since it is desirable that the electrical resistance of the gate electrode 15 be decreased, the electrode layer 15-1 may be preferably made of low-electrical resistance metal such as aluminum (Al) or copper (Cu), as noted above. Moreover, by disposing the barrier metal, such as titanium (Ti) or molybdenum (Mo), between the aluminum (Al), copper (Cu), or the like of the electrode layer 15-1 and the electrode layer 15-2 (ITO, IZO, IGZO, or the like), the electrode layers 15-1 and 15-2 make favorable contact with each other.

An interlayer insulating film 16 is provided on a surface of the substrate 11 (more specifically, a surface of the first barrier film 12a) so as to cover the oxide semiconductor layer 13, the gate insulating film 14, and the gate electrode 15. The interlayer insulating film 16 may have a thickness of, for example, about 2 μm, and be configured with, for example, an organic insulating film made of acrylic, polyimide, or siloxane, or an inorganic insulation film made of oxide silicon, silicon nitride, or aluminum oxide. Alternatively, the interlayer insulating film 16 may be configured with a stacked film formed of the above organic and inorganic insulating films. By using the stacked film formed of, for example, oxide silicon and aluminum oxide, the entry or diffusion of moisture to the oxide semiconductor layer 13 is suppressed. This makes it possible to enhance the electrical stability and reliability of the transistor 10A. The interlayer insulating film 16 is provided with a contact hole H, through which the source/drain electrode 17 is electrically connected to the second part 13b of the oxide semiconductor layer 13.

The source/drain electrode 17 is electrically connected to the second part 13b of the oxide semiconductor layer 13, as described above. More specifically, the source/drain electrode 17 is disposed opposite the second part 13b of the oxide semiconductor layer 13, and is connected to the second part 13b through the contact hole H in the interlayer insulating film 16. The source/drain electrode 17 functions as a source or drain of the transistor 10A, and may be formed of a stacked film configured, for example, by forming a barrier metal made of molybdenum, titanium, or the like on a surface of a metal layer made of aluminum, copper, or the like. It is preferable that in the source/drain electrode 17, the low-electrical resistance metal may be made of aluminum or the like, and the barrier metal may be made of titanium or the like, similar to the gate electrode 15. Using the stacked film formed above enables the wiring delay to be decreased. Furthermore, an aluminum alloy that contains neodymium (Nd), ITO, or the like may be formed on a surface of the source/drain electrode 17. This enables the source/drain electrode 17 to be used for, for example, an anode electrode (pixel electrode) of an organic EL display unit. It is desirable that the source/drain electrode 17 may be provided so as to bypass a region directly above the gate electrode 15, which makes it possible to decrease parasitic capacitance created in a region where the gate electrode 15 crosses the source/drain electrode 17. The decrease in the parasitic capacitance enables the retention capacity 10B to be downsized, thereby enhancing a yield.

(Manufacturing Method)

FIGS. 3A to 6 are cross-sectional views used to describe a method of manufacturing the transistor 10A. The transistor 10A may be manufactured, for example, in the following manner.

Figure 3A:
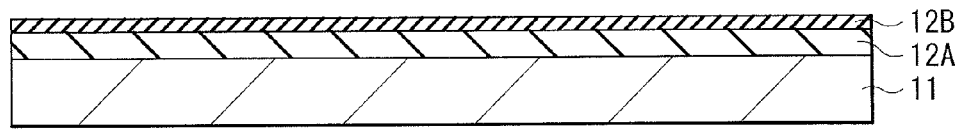
FIG. 3A is a view showing a method of manufacturing the transistor shown in FIG. 1 in order of processes.

As shown in FIG. 3A, first, the first barrier film 12A and the second barrier film 12B, made of the materials above, etc., are formed on an entire surface of the substrate 11 in this order, for example, with a plasma chemical vapor deposition (CVD) or a sputtering method. In this process, the thickness of the second barrier film 12B may be set appropriately, for example, in view of the coverage capacity of the oxide semiconductor layer 13 or the shift amount of the threshold voltage. When the plasma CVD method is employed, a mixed gas containing, for example, silane ($SiH_4$), ammonia ($NH_3$), and nitrogen may be used as a source gas with which the first barrier film 12A (e.g., silicon nitride) is formed. A mixed gas containing, for example, silane and dinitrogen monoxide ($N_2O$) may be used as a source gas with which the second barrier film 12B (e.g., oxide silicon) is formed. When the sputtering method is employed, for example, silicon may be used as a target, and plasma arcs may be generated through the introduction of a gas such as oxygen, vapor, nitrogen, or the like to the interior of a chamber.

Figure 3B:
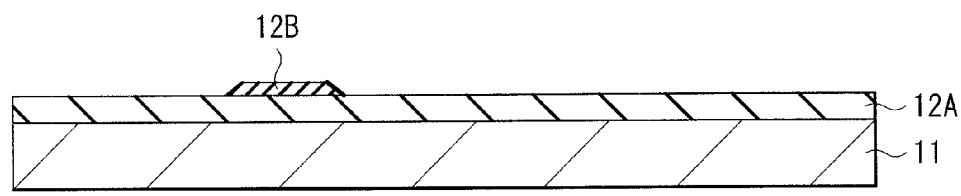
FIG. 3B is a view showing a process that follows the process in FIG. 3A.

After both the first barrier film 12A and the second barrier film 12B have been formed, only the second barrier film 12B is patterned into a desired shape with dry or wet etching, for example, using a photolithography method, as shown in FIG. 3B. In the etching, only the second barrier film 12B is selectively patterned under an etching condition that etching selectivity is obtained between the first barrier film 12A (e.g., silicon nitride) and the second barrier film (e.g., oxide silicon).

Figure 4A:
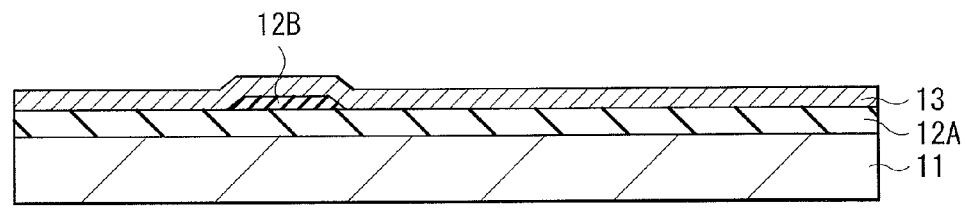
FIG. 4A is a view showing a process that follows the process in FIG. 3B.

Following the etching of the second barrier film 12B, the oxide semiconductor layer 13 is formed. Specifically, as shown in FIG. 4A, the oxide semiconductor layer 13, made of the material above, etc., is formed on the entire surface of the substrate 11 so as to cover both the first barrier film 12A and the second barrier film 12B, for example, with the sputtering method. When IGZO is used as an oxide semiconductor in this process, DC sputtering is performed using a ceramic made of IGZO as a target, and plasma arcs are generated using a mixed gas containing argon and oxygen. In this case, the chamber is evacuated until the degree of vacuum therein becomes $1 \times 10^4$ Pa or lower, and then the plasma arcs are generated through the introduction of the mixed gas of argon and oxygen to the chamber. When zinc oxide is used as the oxide semiconductor, RF sputtering is performed using a ceramic made of zinc oxide as a target or DC sputtering is performed using a ceramic made of zinc as a target, and then plasma arcs are generated using a mixed gas containing argon and oxygen. In this case, it is possible to control a carrier concentration in the oxide semiconductor layer 13 (first part 13a) that acts as a channel by changing a flow ratio of argon to oxygen in the mixed gas.

Figure 4B:
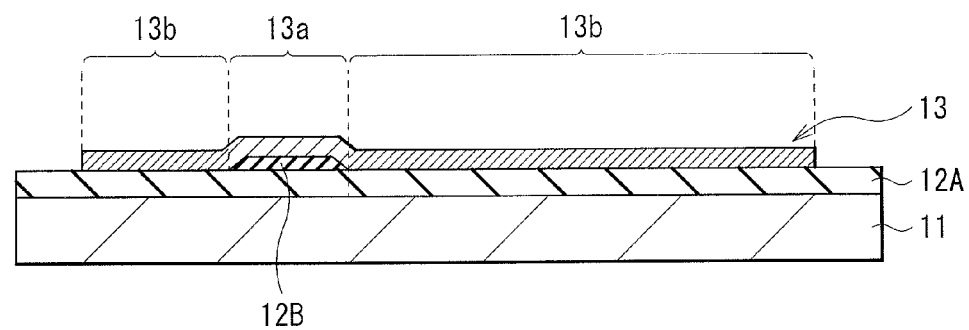
FIG. 4B is a view showing a process that follows the process in FIG. 4A.

After the oxide semiconductor layer 13 has been formed, as shown in FIG. 4B, the oxide semiconductor layer 13 is patterned into a desired shape, for example, with etching using the photolithography method. The oxide semiconductor is typically processed with wet etching, because it melts in either an acid or alkali liquid easily; however the process using dry etching is also possible. When the oxide semiconductor is made of a crystalline material that contains materials such as zinc oxide, indium, gallium, zirconium, and tin, and proportions of indium and tin are higher than those of the other constituent elements, the oxide semiconductor may be subjected to crystallization annealing in order to make it resistant to an etching solvent.

As a result of the patterning of the oxide semiconductor layer 13, in part of the oxide semiconductor layer 13 which is in contact with the first barrier film 12A made of, for example, silicon nitride, its electrical resistance is decreased by the chemical reduction of the hydrogen (the second part 13b is formed). In another part (first part 13a) of the oxide semiconductor layer 13 which is formed on the second barrier film 12B, its property fluctuations due to the influence of the hydrogen contained in the second barrier film 12B are suppressed by the hydrogen barrier property of the second barrier film 12B.

Figure 5A:
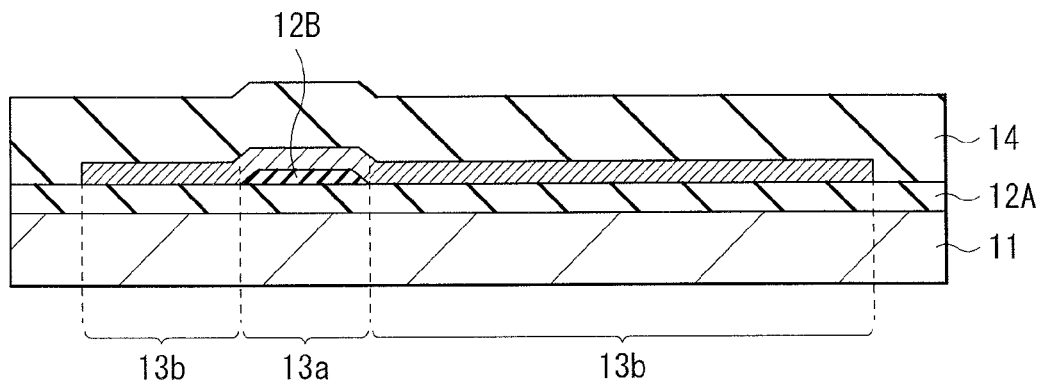
FIG. 5A is a view showing a process that follows the process in FIG. 4B.

Next, as shown in FIG. 5A, the gate insulating film 14 is formed on the entire surface of the substrate 11. In order to form the gate insulating film 14, for example, a process of forming a stacked film of silicon nitride, oxide silicon, and the like with the plasma CVD method may be employed. Alternatively, a process of forming silicon nitride, oxide silicon, aluminum oxide, or aluminum nitride with the sputtering method or the like may be employed.

Figure 5B:
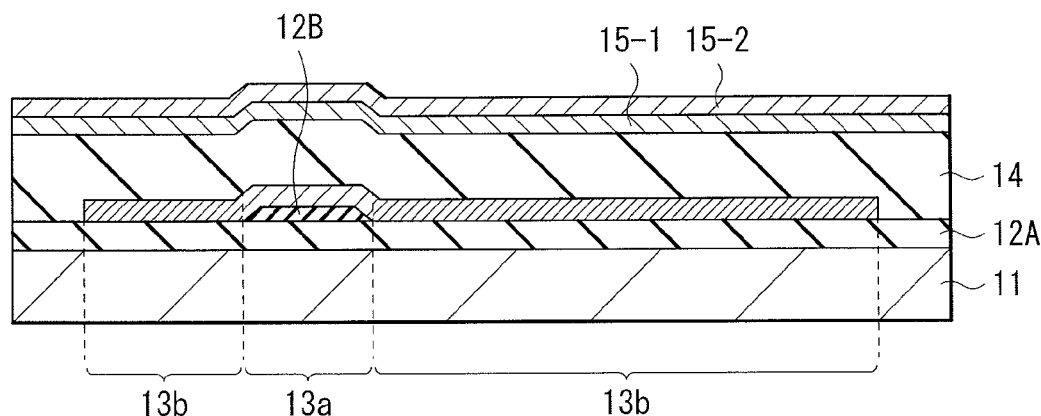
FIG. 5B is a view showing a process that follows the process in FIG. 5A.

Following the forming of the gate insulating film 14, as shown in FIG. 5B, the metal layers 15-1 and 15-2, made of the materials above, etc., are formed on the entire surface of the gate insulating film 14 in this order, for example, with the sputtering method.

Figure 5C:
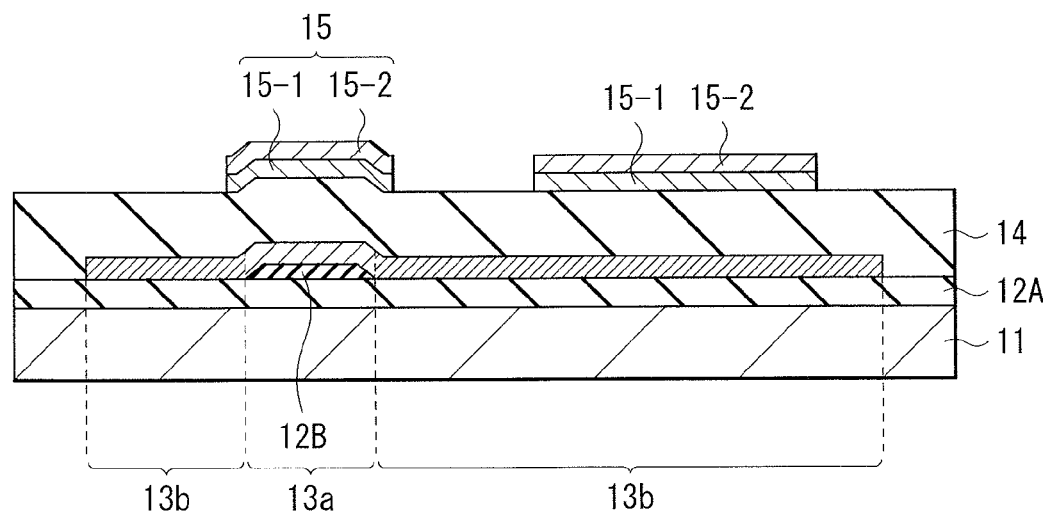
FIG. 5C is a view showing a process that follows the process in FIG. 5B.

After the metal layers 15-1 and 15-2 have been formed, as shown in FIG. 5C, the metal layers 15-1 and 15-2 are patterned, for example, with etching using the photolithography method, so that the gate electrode 15 is formed in a region opposing the first part 13a. In this patterning, the stacked film of the electrode layers 15-1 and 15-2 is also left in a region opposing part of the second part 13b in the oxide semiconductor layer 13, so that the retention capacity 10B is formed.

Figure 5D:
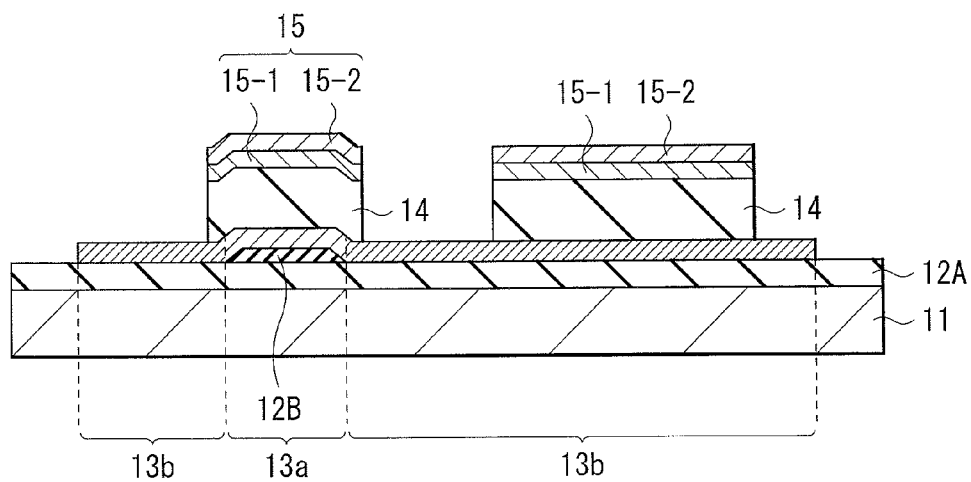
FIG. 5D is a view showing a process that follows the process in FIG. 5C.
Figure 6:
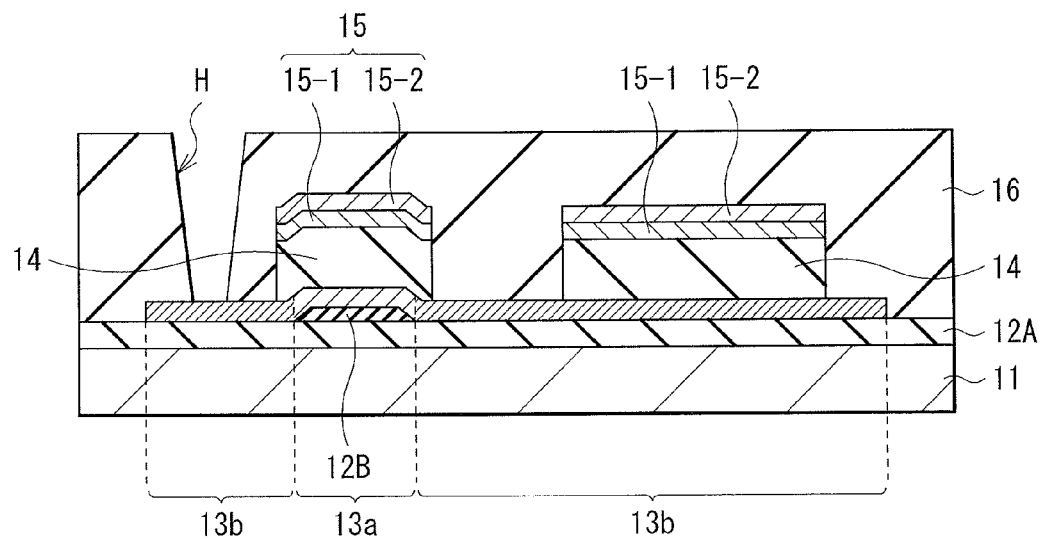
FIG. 6 is a view showing a process that follows the process in FIG. 5D.

Following the patterning of the metal layers 15-1 and 15-2, as shown in FIG. 5D, the gate insulating film 14 is etched, for example, by using the electrode layers 15-1 and 15-2 as masks. The gate insulating film 14 is thereby patterned. When the oxide semiconductor layer 13 is made of a crystallized material such as ZnO, IZO, or IGO, the gate insulating film 14 may be etched with a chemical solution containing hydrofluoric acid or the like. This increases the etching selectivity, facilitating the etching process. As a result, both the gate insulating film 14 and the gate electrode 15 are formed into substantially the same shape on the first part 13a of the oxide semiconductor layer 13 in this order After the patterning of the gate insulating film 14, as shown in FIG. 6, the interlayer insulating film 16, made of the material above, etc., is formed, for example, with the plasma CVD, sputtering, or atomic layer deposition method, or the like. More specifically, when a silicon nitride or oxide silicon film is formed, the plasma CVD method may be used. Alternatively, when an aluminum oxide film or the like is formed, the DC sputtering, AC sputtering, or atomic layer deposition method may be used. Then, the contact hole H is formed on the interlayer insulating film 16 with etching using the photolithography method. Specifically, the contact hole H is formed in a region opposing the second part 13b of the oxide semiconductor layer 13. Then, the source/drain electrode 17, made of the material above, etc., is formed on the interlayer insulating film 16, for example, with the sputtering method, and is patterned, for example, with etching using the photolithography method. This enables the source/drain electrode 17 to be formed so as to be electrically connected to the second part 13b of the oxide semiconductor layer 13. Through the processes above, both the transistor 10A and the retention capacity 10B shown in FIG. 1 are completed.

(Function and Effect)

In the transistor 10A in the present embodiment, the first barrier film 12A is formed on the substrate 11, and the second barrier film 12B that has a barrier property against hydrogen is formed between the first barrier film 12A and the first part 13a of the oxide semiconductor layer 13. With the first barrier film 12A, film qualities of the entire oxide semiconductor layer 13 is suppressed from being deteriorated by impurities, and the electrical resistance of the oxide semiconductor layer 13 is selectively decreased so that the second part 13b is formed. Specifically, in this embodiment, the first barrier film 12A functions as both a barrier that blocks the entry of impurities from the substrate 11 and a source that supplies hydrogen to a predetermined region (second part 13b) of the oxide semiconductor layer 13.

Figure 7:
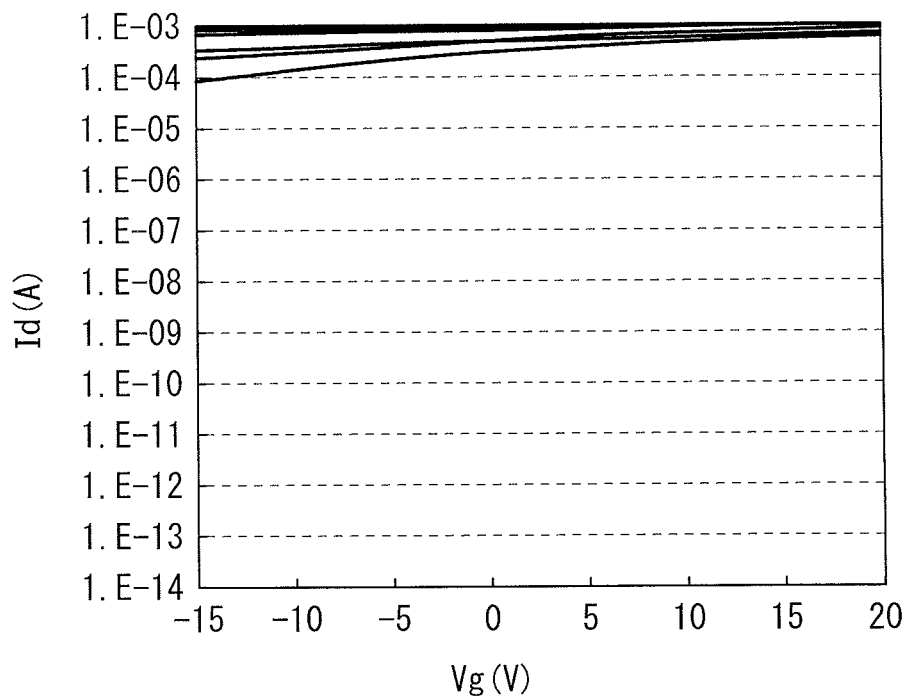
FIG. 7 is a characteristic diagram showing current-voltage characteristics of transistors according to comparative examples.

FIG. 7 shows current-voltage characteristics of top gate type transistors, which are comparative examples in this embodiment in each of which an oxide semiconductor layer was stacked on a silicon nitride film (the second barrier film 12B was not formed). These comparative examples exhibit worsened current-voltage characteristics (worsened on-off characteristics), because the silicon nitride films are in contact with the channels of the oxide semiconductor layers. Since the silicon nitride films, for example, formed with the CVD method, each contain many dangling bonds of hydrogen, the chemical reducing effects of the hydrogen could easily cause the property fluctuations of the oxide semiconductor layers.

Figure 8:
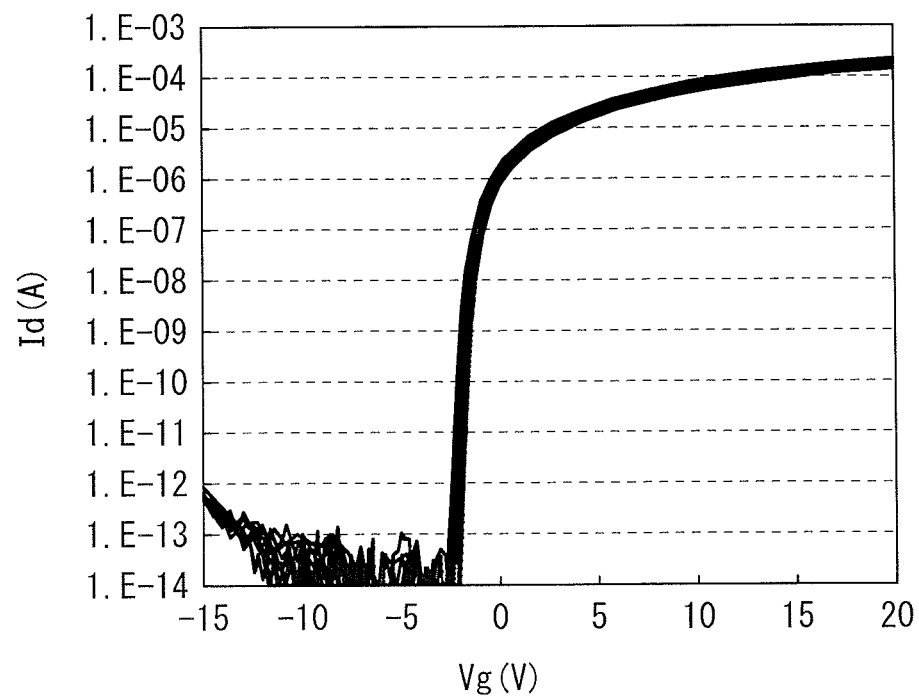
FIG. 8 is a characteristic diagram showing current-voltage characteristics of transistors according to Examples.

In the present embodiment, in contrast, the second barrier film 12B that has a barrier property against hydrogen is formed between the first part 13a of the oxide semiconductor layer 13 and the first barrier film 12A. The interposition of the second barrier film 12B suppresses diffusions of hydrogen from the first barrier film 12A, as described above. This reduces property fluctuations of the first part 13a that would be caused by the chemical reducing effect of the hydrogen. As a result, the excellent current-voltage characteristics, or excellent on-off characteristics, are obtained, for example, as shown in FIG. 8. Note that the characteristic measurement in FIG. 8 was obtained at 16 in-plane points of the substrate 11 in each transistor 10A provided with the stacked structure described above. Here, the thickness of each second barrier film 12B was set to about 20 nm. This reveals that setting the thickness of the second barrier film 12B to at least 20 nm results in the acquaintance of sufficient characteristics and the reduction of a difference in characteristics among the transistor elements.

For example, the transistor described in Japanese Unexamined Patent Application Publication No. 2012-164873 has a top gate type stacked structure in which a silicon nitride film that decreases electrical resistance of an oxide semiconductor layer (supplies hydrogen) is formed on the oxide semiconductor layer, independently of another silicon nitride film that acts as an impurity barrier. In this structure, the silicon nitride films are formed through two different processes, which may cause the increase in the number of manufacturing processes and the manufacturing cost. Furthermore, when the silicon nitride film is formed with the CVD method after the oxide semiconductor layer is formed, the oxide semiconductor may be deteriorated by plasma arcs and hydrogen activated by the plasma arcs. In contrast, the above stacked structure of the first barrier film 12A and the second barrier film 12B in this embodiment enables the first barrier film 12A to function as both a barrier and a hydrogen supply source. For example, this successfully simplifies manufacturing processing, decreases a manufacturing cost, and suppresses an oxide semiconductor from being deteriorated while the film is being formed with the plasma CVD method. Specifically, in the case where the substrate 11 is made of a resin material, the substrate 11 is preferably formed through a CVD process at a low temperature (e.g., about 350° C.). In this process, however, many dangling bonds of hydrogen are prone to being generated in the film. This embodiment therefore becomes effective, in particular, when the substrate 11 is made of a resin material.

In this embodiment, as described above, the first barrier film 12A is formed on the substrate 11, and the second barrier film 12B that has a barrier property against hydrogen is formed between the first barrier film 12A and the first part 13a of the oxide semiconductor layer 13. The first barrier film 12A makes it possible to suppress film qualities of the entire oxide semiconductor layer 13 from being deteriorated by impurities from the substrate 11, and to selectively decrease the electrical resistance in the second part 13b of the oxide semiconductor layer 13. In addition, the interposition of the second barrier film 12B makes it possible to reduce property fluctuations of the first part 13a of the oxide semiconductor layer 13 which would be caused by the chemical reducing effect of the first barrier film 12A. It is thus possible to assure barrier properties, to decrease electrical resistance of a desired region (second part 13b) of the oxide semiconductor layer 13, and to suppress property fluctuations of an active layer (first part 13a). Consequently, excellent transistor characteristics are successfully achieved.

If the transistor 10A described above is applied to active driven type display units and electronic apparatuses as will be described below, it is possible to display high quality images and to support, for example, large screen, high resolution, high frame rate designs.

APPLICATION EXAMPLE

[Display Unit]

Figure 9:
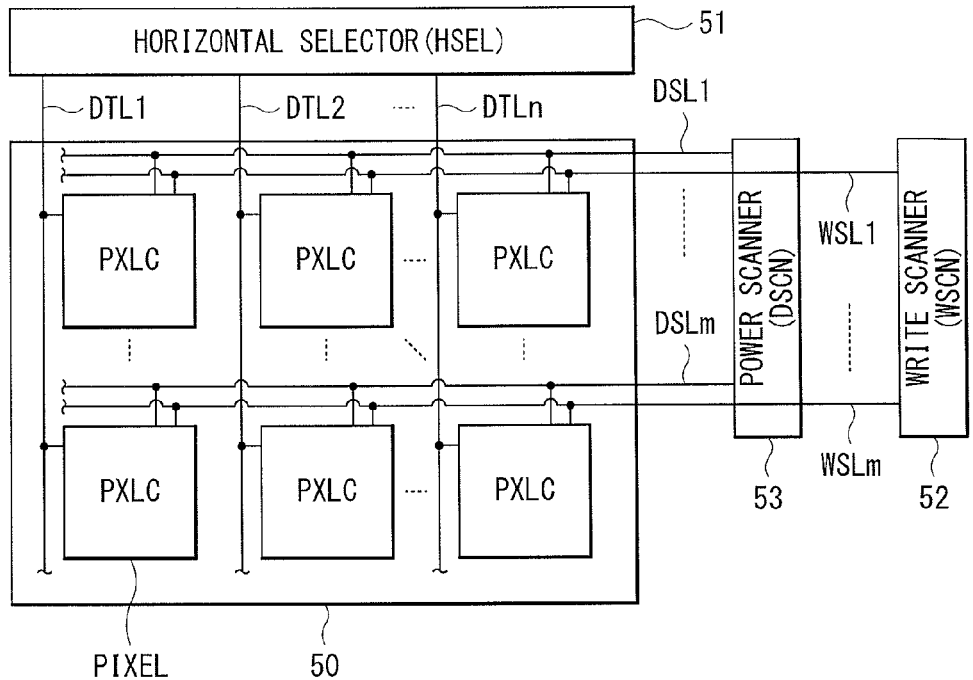
FIG. 9 is a diagram showing an overall configuration of a display unit according to an embodiment of the present disclosure, including its peripheral circuit.

Next, a description will be given of an overall configuration of a display unit that employs the transistors 10A in the embodiment described above, and pixel circuitry. FIG. 9 shows an overall configuration of a display unit used as an organic EL display including its peripheral circuit. As shown in FIG. 9, a display region 50 in which a plurality of pixels PXLC are arranged in a matrix fashion is formed on the substrate 11, and each pixel PXLC includes an organic EL element. In addition, a horizontal selector (HSEL) 51, a write scanner (WSCN) 52, and a power scanner (DSCN) 53 are provided in the vicinity of the display region 50, as a signal line drive circuit, a scan line drive circuit, and a power line drive circuit. However, application of the transistor 10A is not limited to organic EL displays as will be described below; the transistor 10A is applicable to various types of devices, including liquid crystal displays and electric papers.

In the display region 50, a plurality of (an integer n number of) signal lines DTL1 to DTLn are arranged in a column direction; a plurality of (an integer m number of) scan lines WSL1 to WSLm and power lines DSL1 to DSLm are arranged in a row direction. The pixels PXLC (each of which corresponds to one of R, G, and B) are provided at intersections of the signal lines DTL and the scan lines WSL. The signal lines DTL are connected to the horizontal selector 51, and are supplied with image signals from the horizontal selector 51. The scan lines WSL are connected to the write scanner 52, and are supplied with scan signals (selection pulses) from the write scanner 52. The power lines DSL are connected to the power scanner 53, and are supplied with power signals (control pulses) from the power scanner 53.

Figure 10:
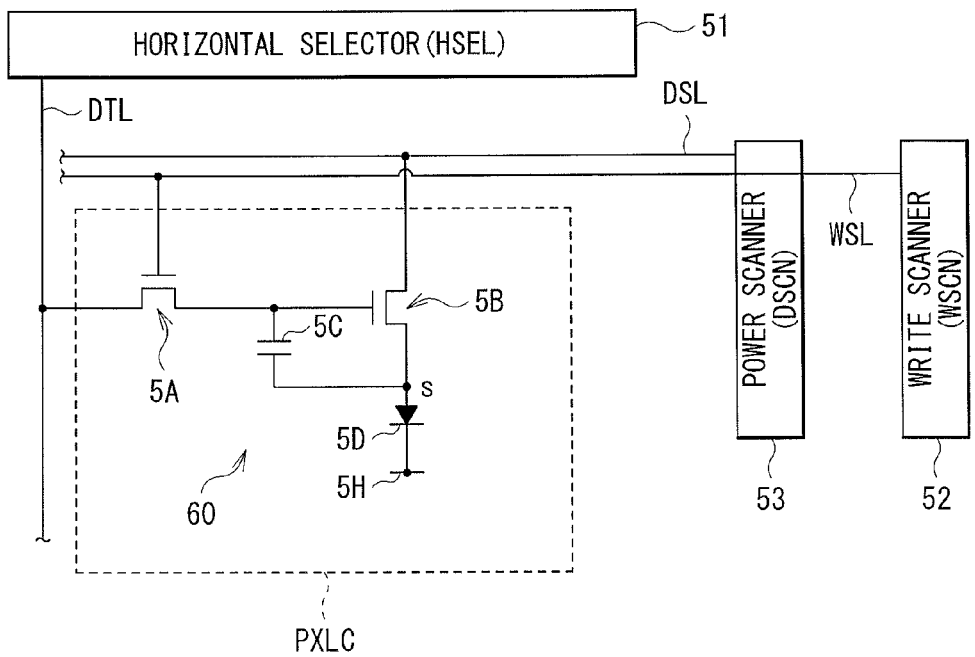
FIG. 10 is a diagram showing pixel circuitry shown in FIG. 9.

FIG. 10 shows a specific example of circuitry in the pixel PXLC. The pixel PXLC has a pixel circuit 60 including an organic EL element 5D. The pixel circuit 60 is an active type drive circuit, and includes a sampling transistor 5A, a drive transistor 5B, the retention capacity element 5C, and the organic EL element 5D. Among these components, the transistor 5A (or the transistor 5B) and the retention capacity element 10B correspond to the transistor 10A and the retention capacity element 5C, respectively, in the embodiment described above.

The sampling transistor 5A has a gate connected to a corresponding one of the scan lines WSL, and a source and drain, one of which is connected to a corresponding one of the signal lines DTL and the other of which is connected to a gate of the drive transistor 5B. The drive transistor 5B has a drain connected to a corresponding one of the power lines DSL, and a source connected to an anode of the organic EL element 5D. A cathode of the organic EL element 5D is connected to a ground wire 5H. The ground wire 5H is connected to all the pixels PXLC so as to be shared by them. The retention capacity element 5C is disposed between the source and gate of the drive transistor 5B.

The sampling transistor 5A conducts a current in response to the scan signal (selection pulse) supplied from the scan line WSL, sampling a signal potential of the image signal supplied from the signal line DTL to retain the sampled signal potential in the retention capacity element 5C. The drive transistor 5B receives a current from the power line DSL set at a preset first potential (not shown), and supplies the drive current to the organic EL element 5D in accordance with the signal potential retained in the retention capacity element 5C. The drive current supplied from the drive transistor 5B causes the organic EL element 5D to emit light of luminance according to the signal potential of the image signal.

In the circuitry described above, the sampling transistor 5A conducts the current in response to the scan signal (selective pulse) supplied from the scan line WSL, sampling the signal potential of the image signal supplied from the signal line DTL to retain the sampled signal potential in the retention capacity element 5C. In addition, the drive transistor 5B receives the current from the power line DSL set as the first potential, and supplies the drive current to the organic EL element 5D (organic EL element for one of red, green, and blue colors) in accordance with the signal potential retained in the retention capacity element 5C. Then, the supplied drive current causes the organic EL element 5D to emit light of luminance according to the signal potential of the image signal. In this manner, the display unit displays an image based on the image signal.

[Electronic Apparatus]

A description will be given below of exemplary electronic apparatuses, each of which is equipped with the display unit using the transistor 10A described above. Examples of electronic apparatuses may include television apparatuses, digital cameras, notebook personal computers, portable terminal devices such as portable phones, and video cameras. In short, the display unit is applicable to electronic apparatuses in various fields in which an image signal externally received or internally generated is displayed as still or moving images.

Figure 11:
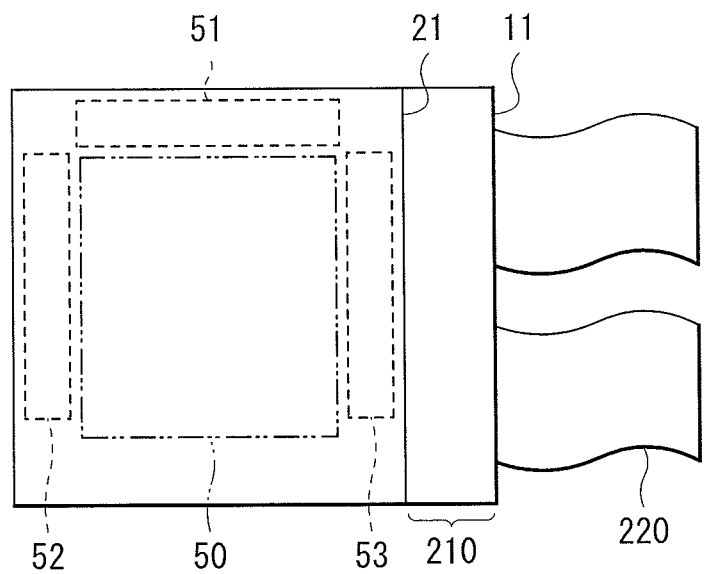
FIG. 11 is a plan view showing an outline of a configuration of a module including the display unit shown in FIG. 9.

The display unit may be incorporated in electronic apparatuses in Application examples 1 to 6 that will be described below, for example, as modules shown in FIG. 11. For example, this module has a region 210 provided on one side of the substrate 11 so as to be exposed from a seal substrate 21, and an external connection terminal (not shown) to which the wires connected to the horizontal selector 51, the write scanner 52, and the power scanner 53 are extended is formed within the region 210. This external connection terminal may be provided with flexible printed circuits 220 through which signals are input or output.

Application Example 1

Figure 12:
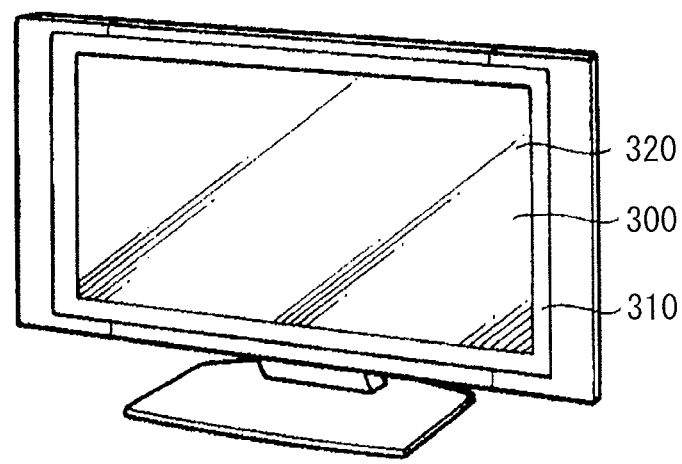
FIG. 12 is a perspective view showing an appearance of Application example 1.

FIG. 12 shows an appearance of a television apparatus. Exemplary components of this television apparatus may be an image display screen section 300 including a front panel 310 and a filter glass 320. The image display screen section 300 corresponds to the display unit described above.

Application Example 2

Figure 13A:
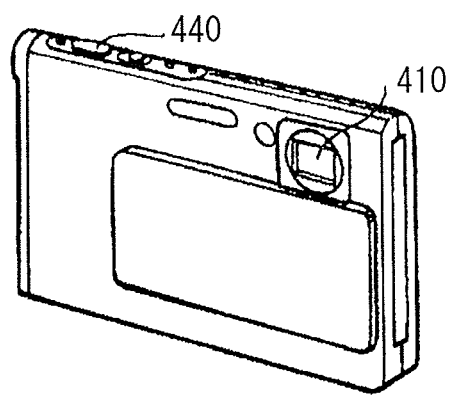
FIG. 13A is a perspective view showing an appearance of Application example 2 as viewed from its front.
Figure 13B:
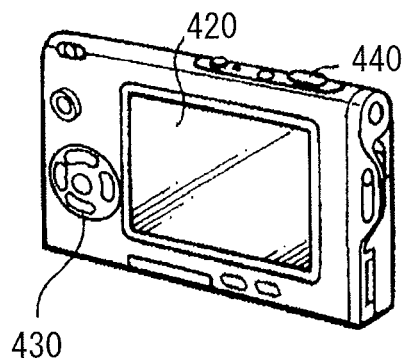
FIG. 13B is a perspective view showing an appearance of Application example 2 as viewed from its rear.

FIGS. 13A and 13B show an appearance of a digital camera. Exemplary components of this digital camera may be a light-emitting section 410 for a flash, a display section 420, a menu switch 430, and a shutter button 440. The display section 420 corresponds to the display unit described above.

Application Example 3

Figure 14:
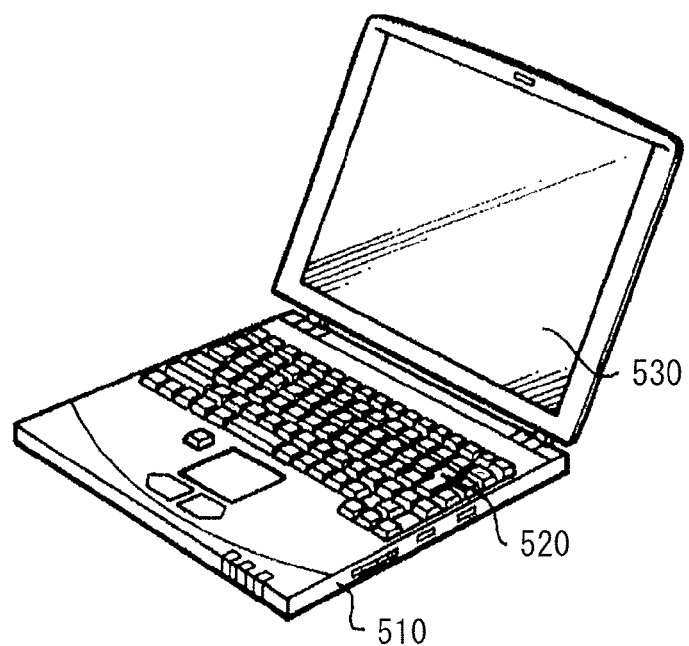
FIG. 14 is a perspective view showing an appearance of Application example 3.

FIG. 14 shows an appearance of a notebook personal computer. Exemplary components of this notebook personal computer may be a main body 510, a keyboard 520 with which operations of inputting characters, letters, and the like are performed, and a display section 530 in which an image is displayed. The display section 530 corresponds to the display unit described above.

Application Example 4

Figure 15:
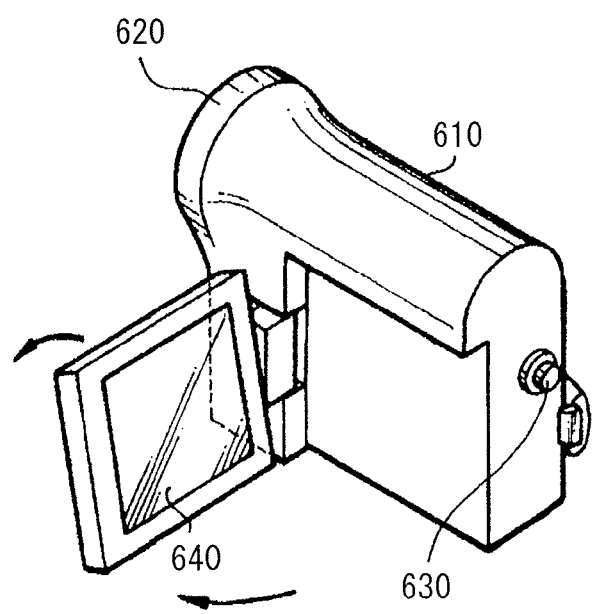
FIG. 15 is a perspective view showing an appearance of Application example 4.

FIG. 15 shows an appearance of a video camera. Exemplary components of this video camera may be a main body section 610, a lens 620 that is used to photograph a subject and is provided on the front side of the main body section 610, a start/stop switch 630 that is used to start or stop a photographing operation, and a display section 640. The display section 640 corresponds to the display unit described above.

Application Example 5

Figure 16A:
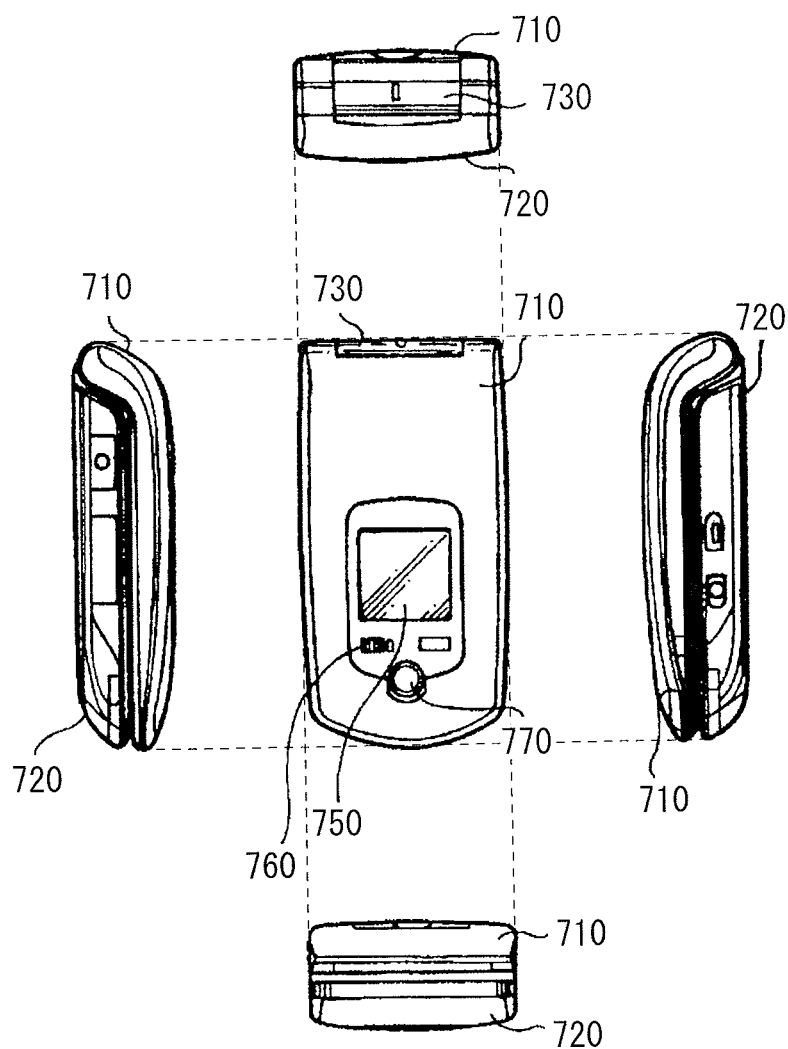
FIG. 16A shows the front surface, left side surface, right side surface, upper surface, and lower surface of Application example 5 in a closed state.
Figure 16B:
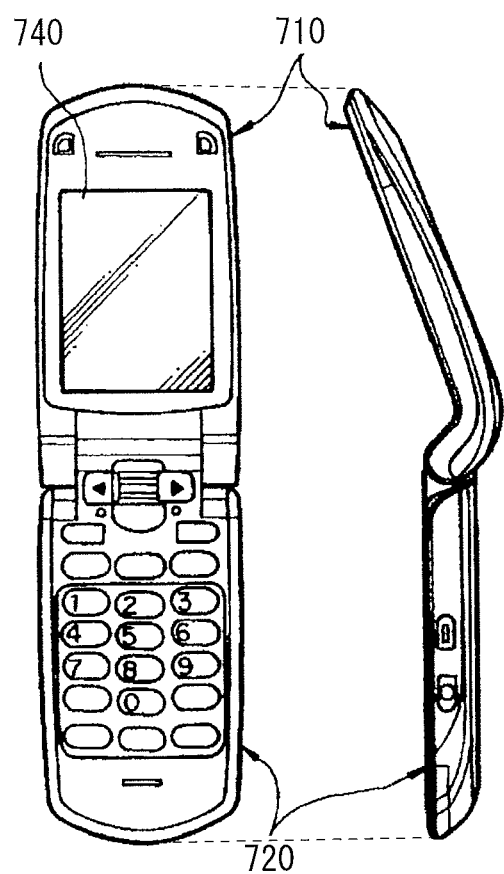
FIG. 16B shows the front surface and side surface of Application example 5 in an opened state.

FIGS. 16A and 16B show an appearance of a portable phone. This portable phone may have an exemplary structure in which an upper housing 710 and a lower housing 720 are joined together by a joint section (hinge section) 730. Exemplary components of the portable phone may be a display 740, a sub-display 750, a picture light 760, and a camera 770. Among them, one or both of the display 740 and the sub-display 750 correspond to the display unit described above.

Application Example 6

Figure 17A:
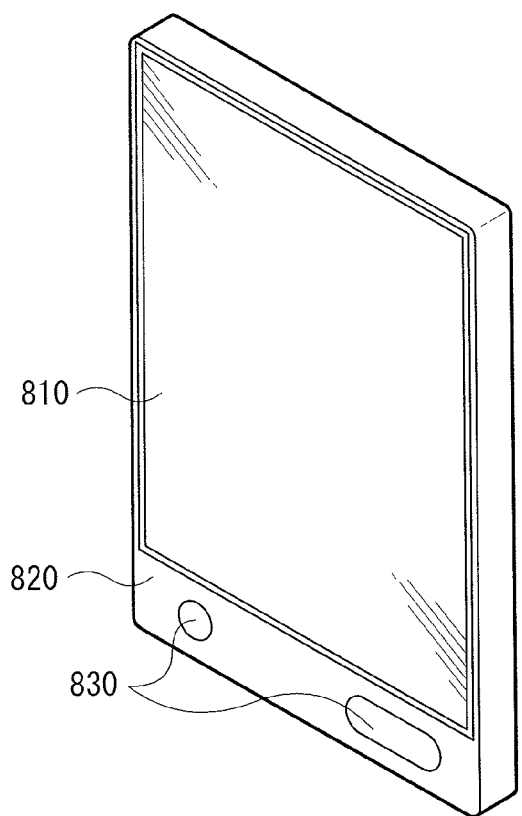
FIG. 17A is a perspective view showing an appearance of Application example 6.
Figure 17B:
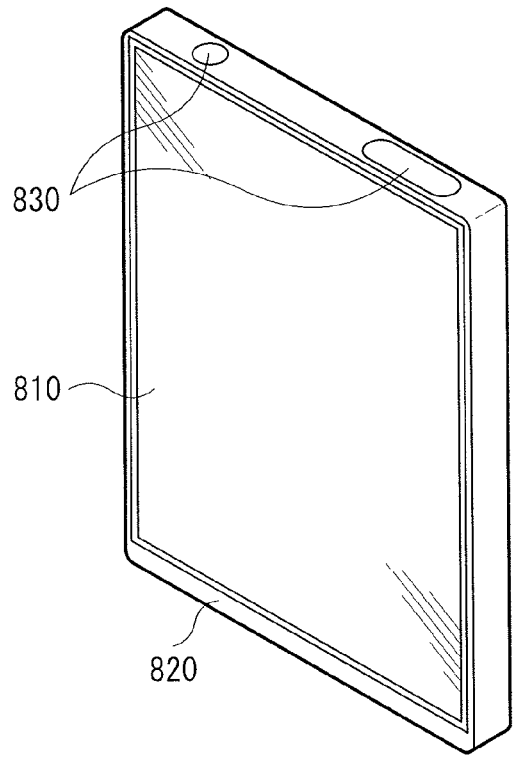
FIG. 17B is a perspective view showing another appearance of Application example 6.

FIGS. 17A and 17B show an appearance of a smart phone. Exemplary components of this smart phone may be a display section 810, a non-display section (casing) 820, and an operation section 830. The operation section 830 may be provided either on the front surface of the non-display section 820 as shown in FIG. 17A or on the upper surface of the non-display section 820 as shown in FIG. 17B.

Up to this point, one embodiment and the like of the present disclosure have been described; however the present disclosure is not limited to the above-described embodiment and the like, and may be modified or varied in various ways. For example, the foregoing embodiment has been described regarding the case where each of the first barrier film 12A and the second barrier film 12B is a single-layered film; however one or both of the first barrier film 12A and the second barrier film 12B may be a multi-layered film.

A configuration of a transistor in an embodiment of the present disclosure is not limited to the stacked structure having been described in the foregoing embodiment, and any additional layer may be formed in the transistor. Also, a material and thickness of each layer, a manufacturing process therefor, and the like are not limited to those described above.

Furthermore, the technology encompasses any possible combination of some or all of the various embodiments described herein and incorporated herein.

It is possible to achieve at least the following configurations from the above-described example embodiments of the disclosure.

(1) A thin-film transistor including:
a substrate;
a first barrier film formed on the substrate;
a second barrier film formed in a selective region on the first barrier film, and having a barrier property against hydrogen;
an oxide semiconductor layer including a first part formed on the second barrier film and a second part formed on the first barrier film, the first part functioning as an active layer, and the second part having lower electrical resistance than the first part;
a gate electrode formed on the first part of the oxide semiconductor layer with a gate insulating film therebetween; and
a source electrode or drain electrode electrically connected to the second part of the oxide semiconductor layer,
the first barrier film having a barrier property against an impurity from the substrate and a property of chemically reducing the oxide semiconductor layer.

(2) The thin-film transistor according to (1), wherein
the first barrier film contains one or both of silicon nitride and silicon oxynitride, and
the second barrier film is a single-layered film or a stacked film that contains one or more of oxide silicon, silicon oxynitride, aluminum oxide, and titanium oxide.

(3) The thin-film transistor according to (1) or (2), wherein the substrate is made of a flexible resin material.

(4) The thin-film transistor according to any one of (1) to (3), wherein the second part of the oxide semiconductor layer is formed in contact with the first barrier film.

(5) The thin-film transistor according to any one of (1) to (4), wherein the gate electrode and the gate insulating film are patterned into same shape as one another.

(6) The thin-film transistor according to any one of (1) to (5), wherein the second part of the oxide semiconductor layer is utilized to form a retention capacity.

(7) The thin-film transistor according to any one of (1) to (6), wherein the source electrode or drain electrode is provided to oppose a portion of the second part of the oxide semiconductor layer.

(8) A display unit provided with a plurality of pixels, each of the pixels being provided with a thin-film transistor, each of the thin-film transistors including:
a substrate;
a first barrier film formed on the substrate;
a second barrier film formed in a selective region on the first barrier film, and having a barrier property against hydrogen;
an oxide semiconductor layer including a first part formed on the second barrier film and a second part formed on the first barrier film, the first part functioning as an active layer, and the second part having lower electrical resistance than the first part;
a gate electrode formed on the first part of the oxide semiconductor layer with a gate insulating film therebetween; and
a source electrode or drain electrode electrically connected to the second part of the oxide semiconductor layer,
the first barrier film having a barrier property against an impurity from the substrate and a property of chemically reducing the oxide semiconductor layer.

(9) The display unit according to (8), wherein the display unit is an organic electroluminescence display unit.

(10) An electronic apparatus provided with a display unit, the display unit being provided with a plurality of pixels, each of the pixels being provided with a thin-film transistor, each of the thin-film transistors including:
a substrate;
a first barrier film formed on the substrate;

a second barrier film formed in a selective region on the first barrier film, and having a barrier property against hydrogen;

an oxide semiconductor layer including a first part formed on the second barrier film and a second part formed on the first barrier film, the first part functioning as an active layer, and the second part having lower electrical resistance than the first part;

a gate electrode formed on the first part of the oxide semiconductor layer with a gate insulating film therebetween; and a source electrode or drain electrode electrically connected to the second part of the oxide semiconductor layer, the first barrier film having a barrier property against an impurity from the substrate and a property of chemically reducing the oxide semiconductor layer.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A thin-film transistor comprising:
a substrate;
a first barrier film formed on the substrate;
a second barrier film formed in a selective region on the first barrier film, and having a barrier property against hydrogen;
an oxide semiconductor layer including a first part formed on the second barrier film and a second part formed on the first barrier film, the first part functioning as an active layer, and the second part having lower electrical resistance than the first part;
a gate electrode formed on the first part of the oxide semiconductor layer with a gate insulating film therebetween; and
a source electrode or drain electrode electrically connected to the second part of the oxide semiconductor layer,
the first barrier film having a barrier property against an impurity from the substrate and a property of chemically reducing the oxide semiconductor layer.

2. The thin-film transistor according to claim 1, wherein
the first barrier film contains one or both of silicon nitride and silicon oxynitride, and
the second barrier film is a single-layered film or a stacked film that contains one or more of oxide silicon, silicon oxynitride, aluminum oxide, and titanium oxide.

3. The thin-film transistor according to claim 1, wherein the substrate is made of a flexible resin material.

4. The thin-film transistor according to claim 1, wherein the second part of the oxide semiconductor layer is formed in contact with the first barrier film.

5. The thin-film transistor according to claim 1, wherein the gate electrode and the gate insulating film are patterned into same shape as one another.

6. The thin-film transistor according to claim 1, wherein the second part of the oxide semiconductor layer is utilized to form a retention capacity.

7. The thin-film transistor according to claim 1, wherein the source electrode or drain electrode is provided to oppose a portion of the second part of the oxide semiconductor layer.

8. A display unit comprising:
a display region provided with a plurality of pixels, each of the pixels being provided with a thin-film transistor, each of the thin-film transistors comprising:
a substrate;
a first barrier film formed on the substrate;
a second barrier film formed in a selective region on the first barrier film, and having a barrier property against hydrogen;
an oxide semiconductor layer including a first part formed on the second barrier film and a second part formed on the first barrier film, the first part functioning as an active layer, and the second part having lower electrical resistance than the first part;
a gate electrode formed on the first part of the oxide semiconductor layer with a gate insulating film therebetween; and
a source electrode or drain electrode electrically connected to the second part of the oxide semiconductor layer, the first barrier film having a barrier property against an impurity from the substrate and a property of chemically reducing the oxide semiconductor layer.

9. The display unit according to claim 8, wherein the display unit is an organic electroluminescence display unit.

10. An electronic apparatus comprising:
a display unit, the display unit including a display region, the display region being provided with a plurality of pixels arranged in a matrix, each of the pixels being provided with a thin-film transistor, each of the thin-film transistors comprising:
a substrate;
a first barrier film formed on the substrate;
a second barrier film formed in a selective region on the first barrier film, and having a barrier property against hydrogen;
an oxide semiconductor layer including a first part formed on the second barrier film and a second part formed on the first barrier film, the first part functioning as an active layer, and the second part having lower electrical resistance than the first part;
a gate electrode formed on the first part of the oxide semiconductor layer with a gate insulating film therebetween; and
a source electrode or drain electrode electrically connected to the second part of the oxide semiconductor layer, the first barrier film having a barrier property against an impurity from the substrate and a property of chemically reducing the oxide semiconductor layer.

* * * * *